United States Patent [19]
Murphy et al.

[11] Patent Number: 6,117,771
[45] Date of Patent: Sep. 12, 2000

[54] METHOD FOR DEPOSITING COBALT

[75] Inventors: William J. Murphy, Essex Junction; Prabhat Tiwari, South Burlington, both of Vt.

[73] Assignee: International Business Machines Corporation, Armonk, N.Y.

[21] Appl. No.: 09/032,194

[22] Filed: Feb. 27, 1998

[51] Int. Cl.$^7$ ........................... H01L 21/44; C23C 14/00; B05D 5/12

[52] U.S. Cl. .................. 438/679; 438/664; 118/50.1; 427/124

[58] Field of Search .................................. 438/664, 679; 118/723 ER, 50.1; 427/124, 564

[56] References Cited

U.S. PATENT DOCUMENTS

| | | |
|---|---|---|
| 4,964,962 | 10/1990 | Nobutani et al. . |
| 5,023,201 | 6/1991 | Stanasolovich et al. . |
| 5,151,385 | 9/1992 | Yamamoto et al. . |
| 5,322,809 | 6/1994 | Moslehi ................................. 437/41 |
| 5,418,188 | 5/1995 | Harper et al. . |
| 5,419,822 | 5/1995 | Dakesian et al. . |
| 5,482,602 | 1/1996 | Cooper et al. . |
| 5,567,651 | 10/1996 | Berti et al. . |
| 5,635,426 | 6/1997 | Hayashi et al. . |
| 5,779,802 | 7/1998 | Borghs .............................. 118/723 MP |

*Primary Examiner*—Tuan H. Nguyen
*Assistant Examiner*—Nema Berezny
*Attorney, Agent, or Firm*—DeLio & Peterson PLLC; John J. Tomaszewski; William D. Sabo

[57] ABSTRACT

A method and apparatus are provided for forming cobalt on a silicon substrate containing native silicon oxide on the surface thereof wherein a modified vapor sputtering device is used. The vapor sputtering device is modified by providing an electrical circuit to ground whereby the wafer disposed in the device is electrically connected to the ground circuit. The ground circuit preferably contains a resistor therein to control wafer voltage and current flow from the wafer to ground. It has been found that providing a current flow from the wafer to ground and particularly in a ground circuit containing a resistor, provides an in-situ simultaneous cleaning of native oxide on the silicon surface and deposition of cobalt on cleaned silicon. The deposited cobalt containing substrate may then be readily annealed to form cobalt silicide evenly and uniformly across the desired regions of the wafer surface. A cobalt coated silicon substrate and an annealed cobalt silicide coated silicon substrate made using the method and apparatus of the invention are also provided as well as electronic components made using the cobalt coated silicon substrate.

17 Claims, 2 Drawing Sheets

METHOD FOR DEPOSITING COBALT

BACKGROUND OF THE INVENTION

1. Field of the Invention

The present invention relates to a method and apparatus for fabricating semiconductor devices and, in particular, to the deposition of cobalt on silicon substrates for the formation of cobalt silicide utilizing a deposition device such as a sputtering device wherein the cobalt is simultaneously deposited on the silicon substrate while the silicon substrate is being cleaned of native oxides on the surface of the silicon. The native oxides inhibit the formation of cobalt silicide when the deposited cobalt layer is annealed.

2. Description of Related Art

Cobalt silicide is formed on semiconductor devices by depositing a layer of cobalt on a silicon substrate and then annealing the deposited cobalt containing surface to form cobalt silicide. The formation of cobalt silicide is important for very high density devices where the feature size is reduced to a fraction of a micrometer. The silicide formed is to provide good ohmic contacts, reduce the sheet resistivity of source/drain regions and polysilicon interconnections, increase the effective contact area and provide an etch stop.

One of the preferred materials useful in forming silicide regions in integrated circuit manufacture is cobalt. Cobalt is preferred instead of alternative materials such as titanium and its alloys, platinum or palladium since the cobalt silicide provides low resistivity, allows shallow junctions, allows lower-temperature processing and other such advantages.

Unfortunately, cobalt silicide formation on the silicon substrate is not uniform for resistance and leakage across the wafer due to the presence of native silicon oxide on the surface of the silicon. The presence of native oxide on the wafer prevents cobalt silicide formation because cobalt is not as reactive as titanium and cannot consume the oxides at the wafer surface during deposition. Metals such as titanium do not have this problem since titanium readily reacts with oxides and exposes clean silicon. Prior to cobalt deposition, the native oxide may be removed by pre-cleaning, but exposure to even low pressure environments results in oxide growth in seconds. In addition, this removal of native oxide is not uniform across the wafer or consistent wafer-to-wafer. Ex-situ precleaning of the wafer is not a solution because the argon gas used in the device during sputtering occupies damaged locations in the silicon and prevents silicide formation and oxides readily reform.

The cobalt silicides and other silicides are usually formed on the surface of a silicon substrate. Various methods are known in the art for depositing the cobalt on the silicon and include chemical vapor deposition (CVD), sputtering and evaporation. For convenience, the following description will be related to a sputtering process using a vacuum sputtering device, but it will be appreciated by those skilled in the art that other such devices may be used to deposit cobalt on a silicon surface.

A silicon substrate is conventionally prepared for cobalt deposition by removal of the native oxide using solutions such as deionized water and HF for an effective period of time followed by rinsing with deionized water. The cleaned wafers are then loaded in a sputtering device which is subsequently evacuated to a low pressure and any remaining native oxide removed by an in-situ RF sputter clean in an argon atmosphere prior to cobalt deposition. Where charge damage is not a concern, this process is not effective since the wafer can reoxidize in 1 second at $10^{-7}$ torr.

In the sputtering process, a coating of cobalt is deposited on the face wafer and the thickness of the cobalt coating is typically up to about 300Å and the coating extends across all exposed surfaces of the face of the wafer. The cobalt is typically sputtered onto a heated wafer using an energy field on the cobalt target to generate cobalt atoms in an atmosphere of argon. After cobalt deposition, the wafer is subjected to a heat treatment to anneal the cobalt to form cobalt silicide. The non-reacted cobalt layer is then removed by an etch treatment using an etchant such as a mixture of hydrogen peroxide and sulfuric acid.

A number of patents have issued showing forming of metal layers on substrates and include U.S. Pat. Nos. 4,964,962; 5,023,201; 5,151,385; 5,418,188; 5,419,822; 5,482,602; 5,567,651; and 5,635,426, which patents are incorporated herein by reference.

Bearing in mind the problems and deficiencies of the prior art, it is therefore an object of the present invention to provide a method for forming cobalt on a substrate typically a silicon substrate which substrate contains native silicon oxide and which oxide is simultaneously removed during deposition, with the deposited cobalt being suitable for annealing to form an even and uniform cobalt silicide coating over the silicon surface.

Another object of the present invention to provide an apparatus or device for forming cobalt on a substrate typically a silicon substrate which substrate contains native silicon oxide and which oxide is simultaneously removed during deposition, with the deposited cobalt capable of being annealed to form cobalt silicide which is uniform and even over the silicon surface.

Another object of the invention is to provide a cobalt coated substrate, particularly a silicon substrate, which is made using the method and apparatus of the invention.

A further object of the present invention to provide a cobalt silicide coated silicon substrate made using the method and apparatus of the invention.

An additional object of the invention is to provide electronic components made using a method and/or apparatus of the invention.

Other objects and advantages of the present invention will be readily apparent from the following description.

SUMMARY OF THE INVENTION

The above and other objects and advantages, which will be apparent to one of skill in the art, are achieved in the present invention which is directed, in a first aspect, to a method for depositing cobalt on a substrate preferably a silicon substrate containing native silicon oxide on the silicon surface thereof with simultaneous cleaning (removing) of the native oxide comprising the steps of:

providing a metal deposition device particularly a vacuum sputtering device, the vacuum sputtering device containing therein a cobalt substrate target to which a current (energy) is applied to form cobalt atoms;

providing, in the vacuum sputtering device, a silicon substrate containing native oxide on the surface thereof;

providing an electrical ground circuit to the device so that the silicon substrate is electrically connected to the ground circuit which circuit is preferably controlled to provide a desired substrate voltage on the surface of the substrate formed by the cobalt atoms impinging on the substrate surface;

evacuating the vacuum sputtering device to provide a vacuum, e.g., a pressure of about $10^{-8}$ to $10^{-10}$ torr;

providing an inert gas such as argon to the evacuated device to provide an inert gas (argon) pressure in the device preferably of, e.g., about 1 to 6 mtorr;

heating the silicon substrate to an elevated temperature preferably up to about 300° C.;

supplying a current (energy) to the cobalt substrate forming cobalt atoms;

preferably adjusting the voltage on the silicon substrate and forming a current from the substrate through the ground circuit; and depositing cobalt onto the silicon substrate.

In another aspect of the invention, an apparatus of the invention is provided for forming cobalt on a substrate preferably a silicon substrate with the silicon substrate having native silicon oxide on the surface thereof comprising:

a vacuum sputtering device for holding a cobalt substrate target to be energized to form cobalt atoms and a silicon substrate on which cobalt atoms are to be deposited;

means to evacuate the vacuum sputtering device to provide a vacuum in the device, e.g., a pressure about $10^{-8}$ to $10^{-10}$ torr;

means for supplying an inert gas such as argon to the vacuum sputtering device, preferably to provide a pressure of about 1 to 6 mtorr;

means for heating the substrate to an elevated temperature preferably up to about 300° C.;

means for supplying energy (e.g., a current) to the cobalt substrate target to form cobalt atoms; and means for electrically connecting the device to a substrate ground circuit whereby the silicon substrate is electrically connected to the substrate ground circuit and a current is formed from the substrate through the ground circuit.

In another aspect of the invention, a cobalt coated silicon substrate is provided which is made using the method and apparatus of the invention. The silicon coated substrate is used to make electronic components.

In a further aspect of the invention, the cobalt coated silicon substrate made using the method and apparatus of the invention is annealed to form a cobalt silicide coated silicon substrate which is used in the manufacture of semiconductor devices.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
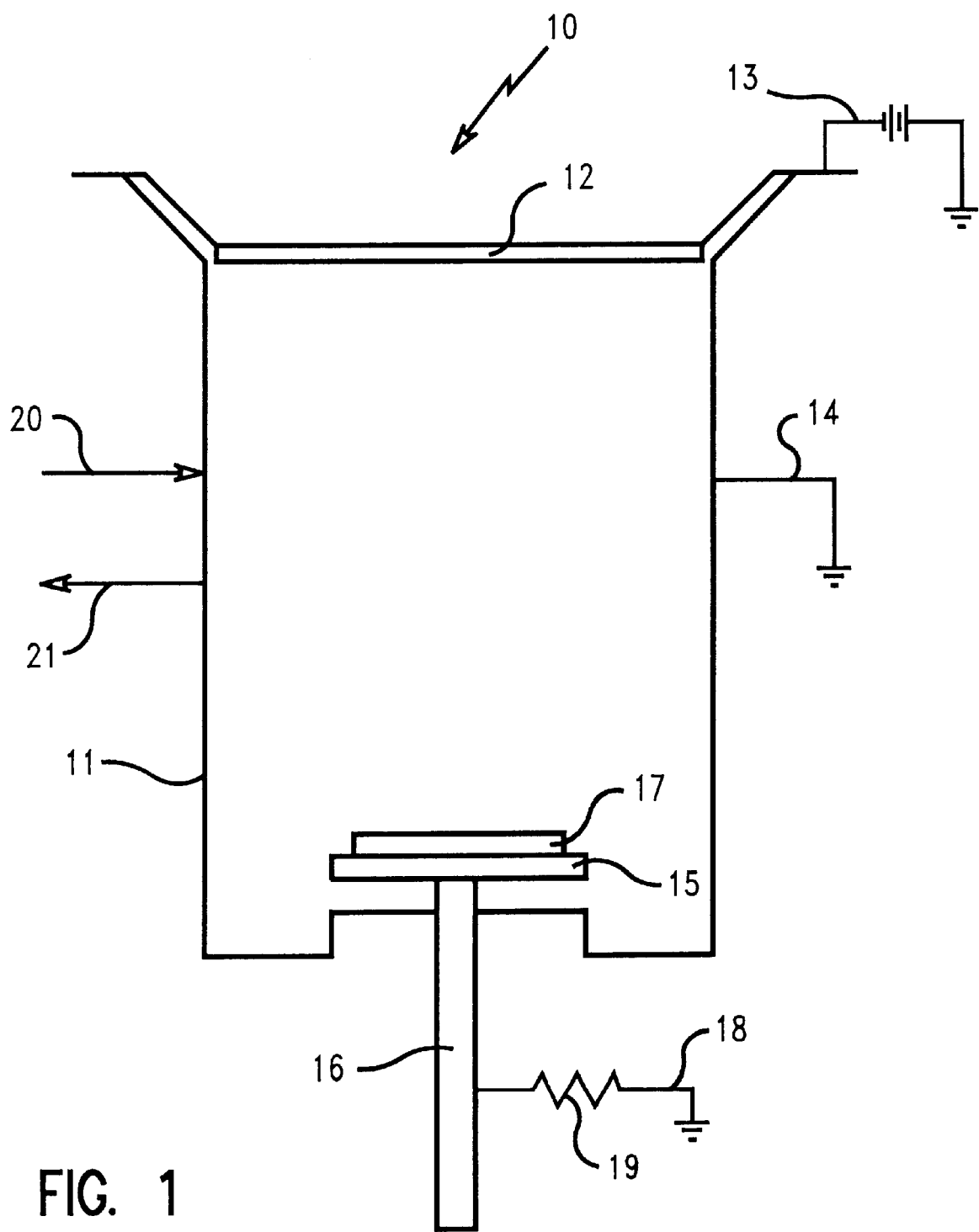
FIG. 1 is a schematic view of a vapor sputtering device of the invention.

In describing the preferred embodiment of the present invention, reference will be made herein to FIGS. 1–2 of the drawings in which like numerals refer to like features of the invention. Features of the invention are not necessarily shown to scale in the drawings.

It has been found that a silicon substrate containing native silicon oxide on the surface thereof can be simultaneously cleaned of the native oxide and cobalt deposited on the cleaned silicon substrate by electrically connecting the deposition device and the substrate to a substrate ground circuit so that a current flow is generated between the silicon substrate and the substrate ground circuit.

FIG. 1 shows a schematic diagram of a vapor sputtering apparatus (device) of the invention. The apparatus is shown generally as 10 and is a conventional apparatus as shown in the prior art device of FIG. 2 and above cited references except for modification of apparatus to provide a grounding circuit for the wafer as described hereinbelow.

In FIG. 1, a vapor sputtering device shown generally as 10 comprises a reactor 11 which forms a chamber therein in which a wafer 17 is disposed. A cobalt target 12 is disposed at the upper end of reactor 11 and the target 12 is electrically connected to an energy source 13. The reactor 11 is grounded by a conventional ground circuit 14.

A pedestal 15 (typically made of stainless steel) is disposed on a vertical shaft 16 (typically made of stainless steel). The silicon wafer 17 on which cobalt is to be deposited is positioned and secured on the pedestal. The vertical shaft 16 is shown electrically connected by circuit 18 to ground. A resistor 19 is preferably in circuit 18 and is used to control the amount of current flow from the wafer 17 to ground which current flow allows uniform and even distribution of cobalt over silicon by the simultaneous cleaning of native oxide from the silicon surface during the deposition process.

In operation, the sputtering process is performed under widely varying conditions as in well-known in the art as discussed in the above-cited patents. For example, the reactor 11 forming the vapor sputtering device is evacuated through line 21 to a pressure about $10^{-8}$ to $10^{-10}$ torr. Argon or other inert gas is shown as an input 20 to the device and the argon gas is flowed into the device at to provide an argon pressure in the sputtering chamber of about 1 to 6 mtorr during the cobalt deposition process. A DC power of about 435 mW/cm² is supplied to the cobalt target 12. The wafer temperature during the deposition process is maintained at about 20° C. to 300° C.

After deposition, the wafer is typically removed from the vapor sputtering device and subjected to a heat treatment which can be performed in a commercially available oven. In general, the wafer temperature in the oven is ramped in a nitrogen flow at about 10° C./sec to about 575° C. and held at 575° C. for about 80 seconds then ramped down at 10° C./second to about 20° C. before removal of the wafer from the oven. This heat treatment forms cobalt silicide regions over areas of silicon on the wafer covered by the cobalt. In other areas containing insulators, no cobalt silicide is formed and the unreacted cobalt is removed as discussed above using any of a variety of etchants.

Figure 2:
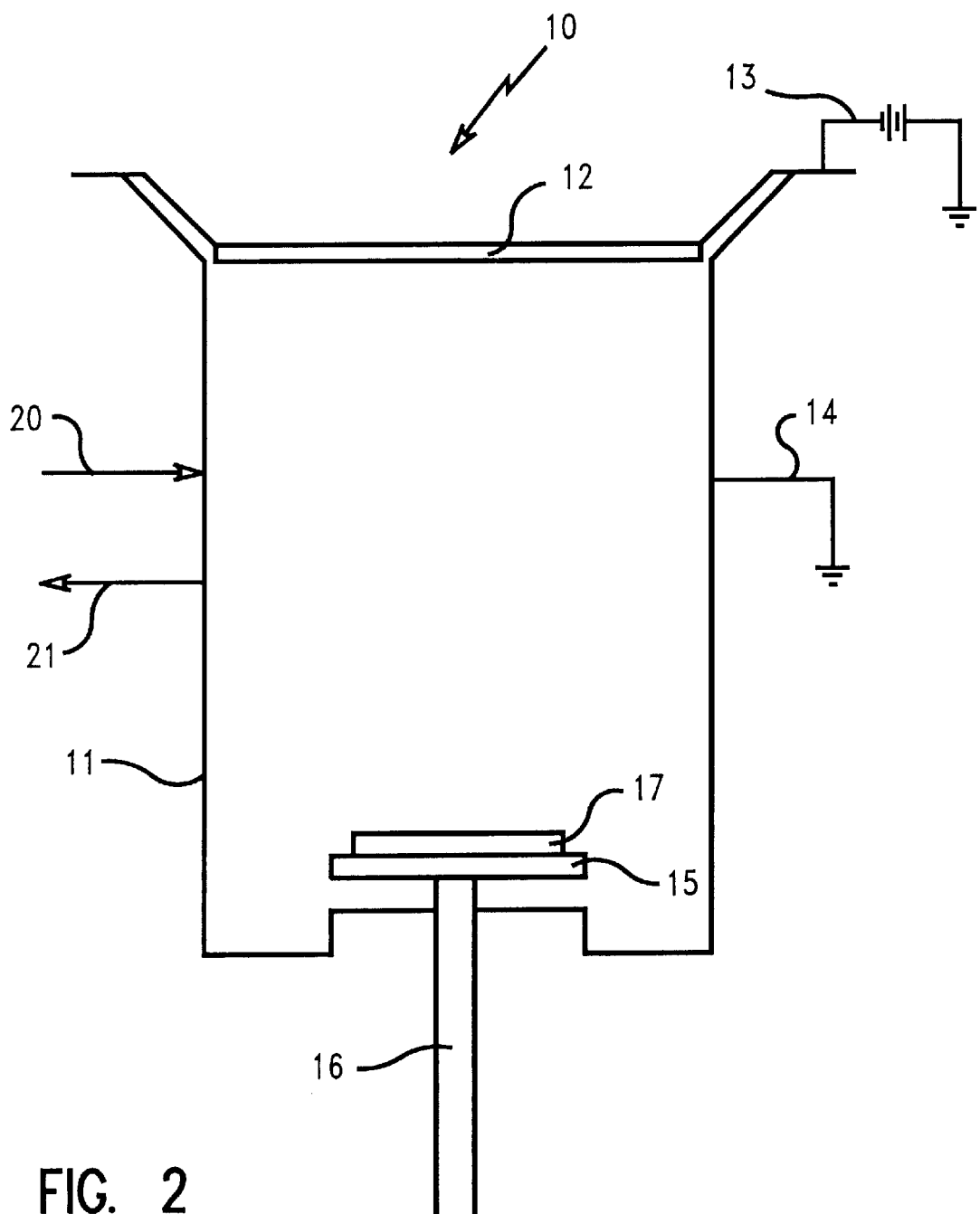
FIG. 2 is a schematic view of a vapor sputtering device of the prior art.

The vapor sputtering device 10 of the prior art shown in FIG. 2 is essentially the same as the vapor sputtering device of the invention shown in FIG. 1. The distinction between the devices is the use of an electrical circuit on the device through which the wafer is grounded. Typically, in a prior art device as shown in FIG. 2, the vapor sputtering device 11 is grounded as with ground 14 but there is no other grounding of the wafer. In some devices, the wafer may be grounded through the pedestal or other leakage in the device, but the ground is typically due to the nature of the apparatus. For example, some sputtering chambers have heater/clamp ring setups which hold the wafer and which provide a path to ground through the cooling water, water lines or other incidental paths. These leakage paths of the wafer to ground are basically unintentional and, in any event, do not provide for the controlled current flow to ground through a ground circuit as claimed needed for effective cobalt deposition on a native oxide containing silicon surface.

As discussed above for FIG. 1, the vapor sputtering device 10 of the invention effectively grounds the wafer 17 using an electrical circuit 18 which preferably contains a resistor 19 in the circuit to control current flow from the wafer to ground. It has been found that this electrical path to ground is essential and enhanced deposition results and silicide formation are obtained by controlling the ground circuit, e.g., by varying the resistance of the circuit. In a preferred embodiment, the resistor 19 is about 5 to 15 ohms to control the circuit to provide a current flow of about 2 amps at a wafer voltage of 20 volts or a power density of about 100 mW/cm$^2$.

In another embodiment of the invention, the resistor is replaced with a power supply with feedback to provide the desired current flow and/or wafer voltage. The power supply may be DC, AC or RF depending on the sputtering chamber design.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for depositing cobalt on a silicon substrate containing native silicon oxide on the silicon surface thereof with simultaneous removing of the native oxide comprising:

providing a vacuum sputtering device, the vacuum sputtering device containing therein a cobalt substrate target to which energy is applied to form cobalt atoms;

providing, in the vacuum sputtering device, a silicon substrate containing native oxide on the surface thereof;

providing an electrical ground circuit to the device so that the silicon substrate is electrically connected to the ground circuit;

evacuating the vacuum sputtering device to provide a vacuum;

providing an inert gas to the evacuated device;

heating the silicon substrate to an elevated temperature;

supplying energy to the cobalt substrate forming cobalt atoms; and simultaneously cleaning the silicon substrate while depositing cobalt onto the silicon substrate by controlling the ground circuit to provide a desired substrate voltage on the surface of the substrate formed by electrons impinging on the substrate surface.

2. The method of claim 1 wherein the ground circuit is controlled to provide a desired substrate voltage on the surface of the substrate formed by the cobalt atoms impinging on the substrate surface.

3. The method of claim 2 wherein the inert gas is argon.

4. The method of claim 3 wherein the argon pressure is about 1 to 6 mtorr.

5. The method of claim 1 wherein the energy source is DC, AC or RF.

6. An apparatus for forming cobalt on a silicon substrate with the silicon substrate having native silicon oxide on the surface thereof comprising:

a vacuum sputtering device for holding a cobalt substrate target to be energized to form cobalt atoms and a silicon substrate on which cobalt atoms are to be deposited;

means to evacuate the vacuum sputtering device to provide a vacuum in the device;

means for supplying an inert gas to the vacuum sputtering device;

means for heating the substrate to an elevated temperature;

means for supplying energy to the cobalt substrate target to form cobalt atoms; and means for electrically connecting the device and the silicon substrate to a ground circuit and forming a current from the substrate through the ground circuit to simultaneously clean the silicon substrate while depositing cobalt onto the silicon substrate by controlling the ground circuit to provide a desired substrate voltage on the surface of the substrate formed by electrons impinging on the substrate surface.

7. The apparatus of claim 6 wherein the device is evacuated to provide a vacuum of about $10^{-8}$ to $10^{-10}$ torr.

8. The apparatus of claim 7 wherein the inert gas is argon.

9. The apparatus of claim 8 wherein the argon pressure is about 1 to 6 mtorr.

10. The apparatus of claim 9 wherein the temperature is about 20 to 300° C.

11. The apparatus of claim 6 wherein the energy means is DC, AC or RF.

12. A method for depositing cobalt on a silicon substrate containing native silicon oxide on the silicon surface thereof with simultaneous removing of the native oxide comprising:

providing a vacuum sputtering device, the vacuum sputtering device containing therein a cobalt substrate target to which energy is applied to form cobalt atoms;

providing, in the vacuum sputtering device, a silicon substrate containing native oxide on the surface thereof;

providing an electrical ground circuit to the device so that the silicon substrate is electrically connected to the ground circuit;

evacuating the vacuum sputtering device to provide a vacuum;

providing argon to the evacuated device at a pressure of about 1 to 6 mtorr;

heating the silicon substrate to an elevated temperature;

supplying energy to the cobalt substrate forming cobalt atoms; and depositing cobalt onto the silicon substrate, wherein the current flow is about 2 amps at a substrate voltage of about −20 volts and the ground circuit is controlled to provide a desired substrate voltage on the surface of the substrate formed by electrons impinging on the substrate surface.

13. A method for depositing cobalt on a silicon substrate containing native silicon oxide on the silicon surface thereof with simultaneous removing of the native oxide comprising:

providing a vacuum sputtering device, the vacuum sputtering device containing therein a cobalt substrate target to which energy is applied to form cobalt atoms;

providing, in the vacuum sputtering device, a silicon substrate containing native oxide on the surface thereof;

providing an electrical ground circuit to the device so that the silicon substrate is electrically connected to the ground circuit, the ground circuit having a resistor therein;

evacuating the vacuum sputtering device to provide a vacuum;

providing an inert gas to the evacuated device;

heating the silicon substrate to an elevated temperature;

supplying energy to the cobalt substrate forming cobalt atoms; and depositing cobalt onto the silicon substrate.

14. A method for depositing cobalt on a silicon substrate containing native silicon oxide on the silicon surface thereof with simultaneous removing of the native oxide comprising:

providing a vacuum sputtering device, the vacuum sputtering device containing therein a cobalt substrate target to which energy is applied to form cobalt atoms;

providing, in the vacuum sputtering device, a silicon substrate containing native oxide on the surface thereof;

providing an electrical ground circuit to the device so that the silicon substrate is electrically connected to the ground circuit, the ground circuit having a power supply with feedback to provide a desired current flow or substrate voltage;

evacuating the vacuum sputtering device to provide a vacuum;

providing an inert gas to the evacuated device;

heating the silicon substrate to an elevated temperature;

supplying energy to the cobalt substrate forming cobalt atoms; and depositing cobalt onto the silicon substrate.

15. An apparatus for forming cobalt on a silicon substrate with the silicon substrate having native silicon oxide on the surface thereof comprising:

a vacuum sputtering device for holding a cobalt substrate target to be energized to form cobalt atoms and a silicon substrate on which cobalt atoms are to be deposited;

means to evacuate the vacuum sputtering device to provide a vacuum in the device of about $10^{-8}$ to $10^{-10}$ torr;

means for supplying argon to the vacuum sputtering device at a pressure of about 1 to 6 mtorr;

means for heating the substrate to a temperature of about 20 to 300° C.;

means for supplying energy to the cobalt substrate target to form cobalt atoms; and means for electrically connecting the device to a ground circuit whereby the silicon substrate is electrically connected to the ground circuit and a current is formed from the substrate through the ground circuit at a current flow of about 2 amps and a substrate voltage of about −20 volts.

16. An apparatus for forming cobalt on a silicon substrate with the silicon substrate having native silicon oxide on the surface thereof comprising:

a vacuum sputtering device for holding a cobalt substrate target to be energized to form cobalt atoms and a silicon substrate on which cobalt atoms are to be deposited;

means to evacuate the vacuum sputtering device to provide a vacuum in the device;

means for supplying an inert gas to the vacuum sputtering device;

means for heating the substrate to an elevated temperature;

means for supplying energy to the cobalt substrate target to form cobalt atoms; and means for electrically connecting the device to a ground circuit whereby the silicon substrate is electrically connected to the ground circuit and a current is formed from the substrate through the ground circuit, the ground circuit having a resistor therein.

17. An apparatus for forming cobalt on a silicon substrate with the silicon substrate having native silicon oxide on the surface thereof comprising:

a vacuum sputtering device for holding a cobalt substrate target to be energized to form cobalt atoms and a silicon substrate on which cobalt atoms are to be deposited;

means to evacuate the vacuum sputtering device to provide a vacuum in the device;

means for supplying an inert gas to the vacuum sputtering device;

means for heating the substrate to an elevated temperature;

means for supplying energy to the cobalt substrate target to form cobalt atoms; and means for electrically connecting the device to a ground circuit whereby the silicon substrate is electrically connected to the ground circuit and a current is formed from the substrate through the ground circuit, the ground circuit having a power supply with feedback to provide a desired current flow or substrate voltage.

* * * * *